United States Patent
Hoshtanar et al.

(10) Patent No.: US 9,495,050 B1
(45) Date of Patent: Nov. 15, 2016

(54) SENSOR PATTERN WITH SIGNAL-SPREADING ELECTRODES

(71) Applicant: Cypress Semiconductor Corporation, San Jose, CA (US)

(72) Inventors: Oleksandr Hoshtanar, Lviv (UA); Igor Kravets, Lviv (UA); Oleksandr Karpin, Lviv (UA); Alexandre Gourevitch, San Jose, CA (US)

(73) Assignee: MONTEREY RESEARCH, LLC, Santa Clara, CA (US)

( * ) Notice: Subject to any disclaimer, the term of this patent is extended or adjusted under 35 U.S.C. 154(b) by 0 days.

(21) Appl. No.: 14/297,115

(22) Filed: Jun. 5, 2014

Related U.S. Application Data

(63) Continuation-in-part of application No. 14/098,057, filed on Dec. 5, 2013.

(60) Provisional application No. 61/875,863, filed on Sep. 10, 2013, provisional application No. 61/946,560, filed on Feb. 28, 2014.

(51) Int. Cl.
*G06F 3/044* (2006.01)

(52) U.S. Cl.
CPC ..... *G06F 3/044* (2013.01); *G06F 2203/04107* (2013.01); *G06F 2203/04111* (2013.01); *G06F 2203/04112* (2013.01)

(58) Field of Classification Search
CPC .............. G01R 27/26; G01R 27/2605; G06F 2203/04111; G06F 2203/04107; G06F 2203/4112
See application file for complete search history.

(56) References Cited

U.S. PATENT DOCUMENTS

| | | |
|---|---|---|
| 6,370,965 B1 | 4/2002 | Knapp |
| 6,639,315 B2 | 10/2003 | Kazama et al. |
| 7,129,935 B2 | 10/2006 | Mackey |
| 7,663,607 B2 | 2/2010 | Hotelling et al. |

(Continued)

FOREIGN PATENT DOCUMENTS

| | | | |
|---|---|---|---|
| EP | 2214084 A | 8/2010 |
| EP | 2592533 A | 5/2013 |

(Continued)

OTHER PUBLICATIONS

U.S. Appl. No. 13/242,703: "Methods and Apparatus to Detect a Conductive Object" Oleksandr Hoshtanar et al., filed on Sep. 23, 2011; 62 pages.

(Continued)

*Primary Examiner* — Huy Q Phan
*Assistant Examiner* — Adam Clarke
(74) *Attorney, Agent, or Firm* — Kunzler Law Group, PC

(57) ABSTRACT

A capacitive sensor array may include a plurality of row sensor electrodes and a column sensor electrode capacitively coupled with each of the plurality of row sensor electrodes to form a plurality of unit cells. For each row sensor electrode, a unit cell that is associated with the column sensor electrode and the row sensor electrode comprises an area where a capacitance between the column sensor electrode and the row sensor electrode is greater than any other capacitance between the column sensor electrode and a different row sensor electrode. The capacitive sensor array further includes a first plurality of dummy electrodes, where each of the first plurality of dummy electrodes is capacitively coupled with the column sensor electrode and two adjacent row sensor electrodes of the plurality of row sensor electrodes.

20 Claims, 13 Drawing Sheets

(56) References Cited

U.S. PATENT DOCUMENTS

| | | |
|---|---|---|
| 7,755,026 B2 | 7/2010 | Pittel et al. |
| 7,755,612 B2 | 7/2010 | Park et al. |
| 7,808,255 B2 | 10/2010 | Hristov et al. |
| 7,812,827 B2 | 10/2010 | Hotelling et al. |
| 7,864,160 B2 | 1/2011 | Geaghan et al. |
| 7,973,771 B2 | 7/2011 | Geaghan |
| 8,004,497 B2 | 8/2011 | Xiaoping |
| 8,174,507 B2 | 5/2012 | Xiaoping |
| 8,217,916 B2 | 7/2012 | Anno |
| 8,237,453 B2 | 8/2012 | Badaye et al. |
| 8,432,170 B1 | 4/2013 | Walsh |
| 8,502,796 B1 | 8/2013 | Yilmaz |
| 8,519,973 B1 | 8/2013 | Xiaoping |
| 8,531,418 B2 | 9/2013 | Nolting et al. |
| 8,536,880 B2 | 9/2013 | Philipp |
| 8,614,690 B2 | 12/2013 | Grunthaner et al. |
| 8,638,107 B2 | 1/2014 | Schwartz et al. |
| 8,648,819 B2 | 2/2014 | Philipp |
| 8,749,518 B2 | 6/2014 | Kuo |
| 8,872,526 B1 | 10/2014 | Hoshtanar et al. |
| 9,151,790 B1 | 10/2015 | Hoshtanar |
| 2005/0200799 A1 | 9/2005 | Murai |
| 2007/0008299 A1 | 1/2007 | Hristov |
| 2007/0074914 A1 | 4/2007 | Geaghan et al. |
| 2007/0257894 A1 | 11/2007 | Philipp |
| 2007/0268265 A1 | 11/2007 | Xiaoping |
| 2007/0268266 A1 | 11/2007 | Xiaoping |
| 2007/0291009 A1 | 12/2007 | Wright et al. |
| 2008/0156546 A1 | 7/2008 | Hauck |
| 2008/0158175 A1 | 7/2008 | Hotelling et al. |
| 2008/0309633 A1 | 12/2008 | Hotelling et al. |
| 2009/0002396 A1 | 1/2009 | Andrews et al. |
| 2009/0120697 A1 | 5/2009 | Wilner et al. |
| 2009/0135157 A1 | 5/2009 | Harley |
| 2009/0159344 A1 | 6/2009 | Hotelling et al. |
| 2009/0189866 A1 | 7/2009 | Haffenden et al. |
| 2009/0252386 A1 | 10/2009 | Dean et al. |
| 2009/0267916 A1* | 10/2009 | Hotelling .................. 345/174 |
| 2009/0273570 A1 | 11/2009 | Degner et al. |
| 2009/0303196 A1 | 12/2009 | Furukawa |
| 2010/0045614 A1 | 2/2010 | Gray et al. |
| 2010/0045615 A1 | 2/2010 | Gray et al. |
| 2010/0046561 A1 | 2/2010 | Grant et al. |
| 2010/0073301 A1 | 3/2010 | Yousefpor et al. |
| 2010/0079384 A1 | 4/2010 | Grivna |
| 2010/0079402 A1 | 4/2010 | Grunthaner et al. |
| 2010/0096193 A1 | 4/2010 | Yilmaz et al. |
| 2010/0110038 A1* | 5/2010 | Mo et al. .................. 345/174 |
| 2010/0123670 A1* | 5/2010 | Philipp .................... 345/173 |
| 2010/0163394 A1* | 7/2010 | Tang et al. ................ 200/600 |
| 2010/0193257 A1 | 8/2010 | Hotelling et al. |
| 2010/0214233 A1 | 8/2010 | Lee |
| 2010/0220075 A1 | 9/2010 | Kuo et al. |
| 2010/0253651 A1 | 10/2010 | Day |
| 2010/0271330 A1 | 10/2010 | Philipp |
| 2010/0289503 A1 | 11/2010 | Reynolds et al. |
| 2010/0295821 A1 | 11/2010 | Chang et al. |
| 2010/0302201 A1 | 12/2010 | Ritter et al. |
| 2010/0328228 A1 | 12/2010 | Elias |
| 2010/0328255 A1 | 12/2010 | Ishizaki et al. |
| 2011/0006832 A1 | 1/2011 | Land et al. |
| 2011/0007020 A1 | 1/2011 | Hong et al. |
| 2011/0025629 A1 | 2/2011 | Grivna et al. |
| 2011/0063251 A1 | 3/2011 | Geaghan et al. |
| 2011/0095990 A1 | 4/2011 | Philipp et al. |
| 2011/0115729 A1 | 5/2011 | Kremin et al. |
| 2011/0141062 A1 | 6/2011 | Yu et al. |
| 2011/0157050 A1 | 6/2011 | Jang et al. |
| 2011/0171998 A1 | 7/2011 | Westerman |
| 2011/0279410 A1 | 11/2011 | Han et al. |
| 2012/0044197 A1 | 2/2012 | Polishchuk et al. |
| 2012/0044201 A1 | 2/2012 | Xiaoping |
| 2012/0044203 A1* | 2/2012 | Ishizaki et al. ............ 345/174 |
| 2012/0062472 A1 | 3/2012 | Yilmaz |
| 2012/0062510 A1 | 3/2012 | Mo et al. |
| 2012/0092350 A1 | 4/2012 | Ganapathi et al. |
| 2012/0127099 A1 | 5/2012 | Liu et al. |
| 2012/0154324 A1 | 6/2012 | Wright et al. |
| 2012/0169651 A1 | 7/2012 | Chang |
| 2012/0169653 A1 | 7/2012 | Chang |
| 2012/0169655 A1 | 7/2012 | Chang |
| 2012/0169656 A1 | 7/2012 | Chang |
| 2012/0227259 A1* | 9/2012 | Badaye et al. .................. 29/846 |
| 2012/0268416 A1 | 10/2012 | Pirogov et al. |
| 2012/0319974 A1 | 12/2012 | Kim et al. |
| 2013/0015868 A1* | 1/2013 | Peng ............................ 324/688 |
| 2013/0027344 A1 | 1/2013 | Choon |
| 2013/0033451 A1 | 2/2013 | Olson |
| 2013/0049771 A1 | 2/2013 | Peng et al. |
| 2013/0082719 A1 | 4/2013 | Prendergast et al. |
| 2013/0242485 A1 | 9/2013 | Ohtani et al. |
| 2013/0285975 A1 | 10/2013 | Hong et al. |
| 2014/0009215 A1* | 1/2014 | Prest et al. .................... 327/517 |
| 2014/0125361 A1 | 5/2014 | Tevs |
| 2014/0152919 A1 | 6/2014 | Philipp |
| 2014/0160374 A1* | 6/2014 | Wang et al. .................... 349/12 |
| 2014/0313159 A1* | 10/2014 | Wilson ................... G06F 3/044 345/174 |

FOREIGN PATENT DOCUMENTS

| | | |
|---|---|---|
| KR | 20100032283 A | 3/2010 |
| KR | 100979910 B1 | 9/2010 |
| KR | 20100116281 A | 11/2010 |
| WO | 2008079596 A1 | 7/2008 |
| WO | 2010062808 A2 | 6/2010 |
| WO | 2011015827 A | 2/2011 |
| WO | 2011058562 A | 5/2011 |

OTHER PUBLICATIONS

Camacho, Oscar, "Designing Touch Sensing Electrodes," Freescale Semiconductor Application Note, Document No. AN3863, Rev. 4, Jul. 2011; 28 pages.

International Search Report and Written Opinion of the International Searching Authority for International Application No. PCT/IB2011/003294 mailed Jun. 22, 2012; 11 pages.

Lee, et al., "A Multi-Touch Three Dimensional Touch-Sensitive Tablet", Computer Systems Research Institute, University of Toronto, Apr. 1985; 5 pages.

ST Microelectronics, "Guidelines for Designing Touch Sensing Applications with Surface Sensors", retrieved from http://www.st.com/st-web-ui/static/active/jp/resource/technical/document/application_note/DM00087990.pdf, dated Sep. 30, 2013; 36 pages.

USPTO Advisory Action for U.S. Appl. No. 13/242,703 dated Mar. 5, 2015; 2 pages.

USPTO Advisory Action for U.S. Appl. No. 13/242,703 dated Jun. 20, 2014; 3 pages.

USPTO Final Rejection for U.S. Appl. No. 13/242,703 dated Apr. 8, 2014; 19 pages.

USPTO Final Rejection for U.S. Appl. No. 13/242,703 dated Dec. 10, 2015; 21 pages.

USPTO Final Rejection for U.S. Appl. No. 13/342,703 dated Dec. 15, 2014; 21 pages.

USPTO Final Rejection for U.S. Appl. No. 14/098,057 dated Jun. 19, 2014; 14 pages.

USPTO Non-Final Rejection for U.S. Appl. No. 13/242,703 dated May 28, 2015; 16 pages.

USPTO Non-Final Rejection for U.S. Appl. No. 13/242,703 dated Aug. 1, 2014; 21 pages.

USPTO Non-Final Rejection for U.S. Appl. No. 13/242,703 dated Sep. 14, 2015; 14 pages.

USPTO Non-Final Rejection for U.S. Appl. No. 13/242,703 dated Sep. 26, 2013; 18 pages.

USPTO Non-Final Rejection for U.S. Appl. No. 13/693,927 dated Mar. 16, 2015; 9 pages.

USPTO Non-Final Rejection for U.S. Appl. No. 14/098,057 dated Feb. 20, 2014; 19 pages.

(56) References Cited

OTHER PUBLICATIONS

USPTO Notice of Allowance for U.S. Appl. No. 13/693,927 dated Jun. 8, 2015; 7 pages.
USPTO Notice of Allowance for U.S. Appl. No. 14/098,057 dated Jul. 7, 2014; 8 pages.
USPTO Notice of Allowance for U.S. Appl. No. 14/098,057 dated Aug. 15, 2014; 8 pages.
USPTO Notice of Allowance for U.S. Appl. No. 14/098,057 dated Sep. 16, 2014; 8 pages.
Yazici, Serkan, "Suppression of Spurious Modes via Dummy Electrodes and 2% Frequency Shift via Cavity Size Selection for 1 GHz AlN MEMS Contour-Mode Resonators," IEEE Frequency Control Symposium (FCS), May 21-24, 2012, pp. 1-5; 5 pages.

\* cited by examiner

SENSOR PATTERN WITH SIGNAL-SPREADING ELECTRODES

RELATED APPLICATIONS

This application claims priority to U.S. Provisional Application No. 61/946,560, filed on Feb. 28, 2014, and is a continuation-in-part of U.S. patent application Ser. No. 14/098,057, filed on Dec. 5, 2013, which claims priority to U.S. Provisional Application No. 61/875,863, filed on Sep. 10, 2013, all of which are incorporated by reference herein in their entirety.

TECHNICAL FIELD

This disclosure relates to the field of touch-sensors and, in particular, to capacitive touch-sensor arrays.

BACKGROUND

Computing devices, such as notebook computers, personal data assistants (PDAs), kiosks, and mobile handsets, have user interface devices, which are also known as human interface devices (HID). One user interface device that has become more common is a touch-sensor pad (also commonly referred to as a touchpad). A basic notebook computer touch-sensor pad emulates the function of a personal computer (PC) mouse. A touch-sensor pad is typically embedded into a PC notebook for built-in portability. A touch-sensor pad replicates mouse X/Y movement by using two defined axes which contain a collection of sensor electrodes that detect the position of one or more conductive objects, such as a finger. Mouse right/left button clicks can be replicated by two mechanical buttons, located in the vicinity of the touchpad, or by tapping commands on the touch-sensor pad itself. The touch-sensor pad provides a user interface device for performing such functions as positioning a pointer, or selecting an item on a display. These touch-sensor pads may include multi-dimensional sensor arrays for detecting movement in multiple axes. The sensor array may include a one-dimensional sensor array, detecting movement in one axis. The sensor array may also be two dimensional, detecting movements in two axes.

Another user interface device that has become more common is a touch screen. Touch screens, also known as touchscreens, touch windows, touch panels, or touchscreen panels, are transparent display overlays which are typically either pressure-sensitive (resistive or piezoelectric), electrically-sensitive (capacitive), acoustically-sensitive (surface acoustic wave (SAW)) or photo-sensitive (infra-red). The effect of such overlays allows a display to be used as an input device, removing the keyboard and/or the mouse as the primary input device for interacting with the display's content. Such displays can be attached to computers or, as terminals, to networks. Touch screens have become familiar in retail settings, on point-of-sale systems, on ATMs, on mobile handsets, on kiosks, on game consoles, and on PDAs where a stylus is sometimes used to manipulate the graphical user interface (GUI) and to enter data. A user can touch a touch screen or a touch-sensor pad to manipulate data. For example, a user can apply a single touch, by using a finger to touch the surface of a touch screen, to select an item from a menu.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

In one embodiment, a capacitive sensor array used to track the movement of a contact, such as a finger or stylus touch, across its surface may include multiple signal-spreading dummy electrodes within its sensor pattern. The inclusion of such signal-spreading dummy electrodes increases linearity of the touch tracking relative to a sensor array that does not include signal-spreading dummy electrodes. As described herein, the term "dummy electrode" may refer to an electrode that is not conductively coupled with a row or column sensor electrode, but does not necessarily imply a lack of electrical function.

Figure 1:
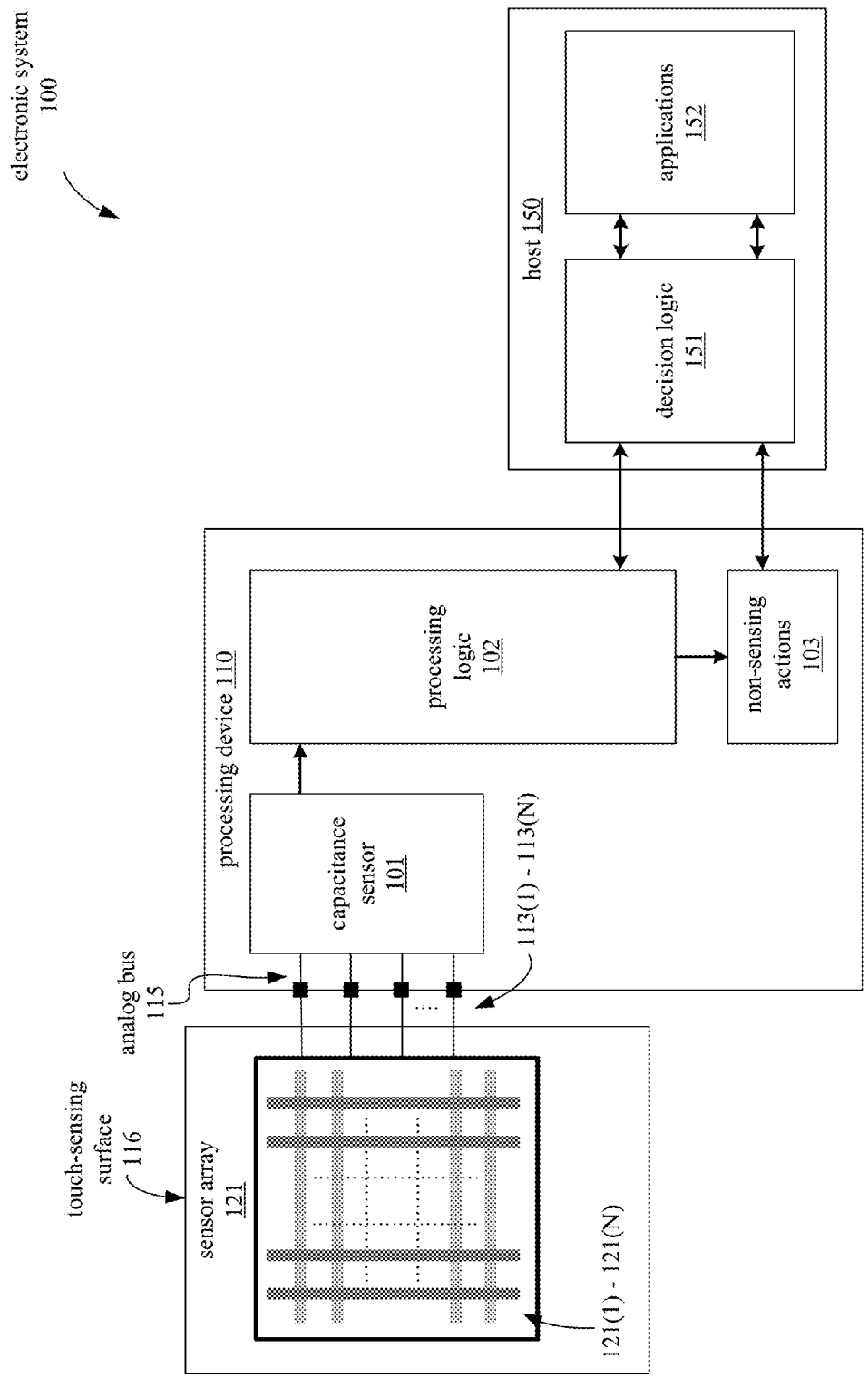
FIG. 1 is a block diagram illustrating an embodiment of an electronic system that processes touch sensor data.

FIG. 1 illustrates a block diagram of one embodiment of an electronic system 100 including a processing device 110 that may be configured to measure capacitances from a touch sensing surface 116 implemented using a capacitive sensor array that includes the signal-spreading dummy electrodes as described above. The electronic system 100 includes a touch-sensing surface 116 (e.g., a touchscreen, or a touch pad) coupled to the processing device 110 and a host 150. In one embodiment, the touch-sensing surface 116 is a two-dimensional user interface that uses a sensor array 121 to detect touches on the surface 116.

In one embodiment, the sensor array 121 includes sensor electrodes 121(1)-121(N) (where N is a positive integer) that are disposed as a two-dimensional matrix (also referred to as an XY matrix). The sensor array 121 is coupled to pins 113(1)-113(N) of the processing device 110 via one or more analog buses 115 transporting multiple signals. In this embodiment, each sensor electrode 121(1)-121(N) is represented as a capacitor.

In one embodiment, the capacitance sensor 101 may include a relaxation oscillator or other means to convert a capacitance into a measured value. The capacitance sensor 101 may also include a counter or timer to measure the oscillator output. The processing device 110 may further include software components to convert the count value (e.g., capacitance value) into a sensor electrode detection decision (also referred to as switch detection decision) or relative magnitude. It should be noted that there are various known methods for measuring capacitance, such as current versus voltage phase shift measurement, resistor-capacitor charge timing, capacitive bridge divider, charge transfer, successive approximation, sigma-delta modulators, charge-accumulation circuits, field effect, mutual capacitance, frequency shift, or other capacitance measurement algorithms. It should be noted however, instead of evaluating the raw counts relative to a threshold, the capacitance sensor 101 may be evaluating other measurements to determine the user interaction. For example, in the capacitance sensor 101 having a sigma-delta modulator, the capacitance sensor 101 is evaluating the ratio of pulse widths of the output, instead of the raw counts being over or under a certain threshold.

In one embodiment, the processing device 110 further includes processing logic 102. Operations of the processing logic 102 may be implemented in firmware; alternatively, it may be implemented in hardware or software. The processing logic 102 may receive signals from the capacitance sensor 101, and determine the state of the sensor array 121, such as whether an object (e.g., a finger) is detected on or in proximity to the sensor array 121 (e.g., determining the presence of the object), where the object is detected on the sensor array (e.g., determining the location of the object), tracking the motion of the object, or other information related to an object detected at the touch sensor.

In another embodiment, instead of performing the operations of the processing logic 102 in the processing device 110, the processing device 110 may send the raw data or partially-processed data to the host 150. The host 150, as illustrated in FIG. 1, may include decision logic 151 that performs some or all of the operations of the processing logic 102. Operations of the decision logic 151 may be implemented in firmware, hardware, software, or a combination thereof. The host 150 may include a high-level Application Programming Interface (API) in applications 152 that perform routines on the received data, such as compensating for sensitivity differences, other compensation algorithms, baseline update routines, start-up and/or initialization routines, interpolation operations, or scaling operations. The operations described with respect to the processing logic 102 may be implemented in the decision logic 151, the applications 152, or in other hardware, software, and/or firmware external to the processing device 110. In some other embodiments, the processing device 110 is the host 150.

In another embodiment, the processing device 110 may also include a non-sensing actions block 103. This block 103 may be used to process and/or receive/transmit data to and from the host 150. For example, additional components may be implemented to operate with the processing device 110 along with the sensor array 121 (e.g., keyboard, keypad, mouse, trackball, LEDs, displays, or other peripheral devices).

The processing device 110 may reside on a common carrier substrate such as, for example, an integrated circuit (IC) die substrate, or a multi-chip module substrate. Alternatively, the components of the processing device 110 may be one or more separate integrated circuits and/or discrete components. In one embodiment, the processing device 110 may be the Programmable System on a Chip (PSoC™) processing device, developed by Cypress Semiconductor Corporation, San Jose, Calif. Alternatively, the processing device 110 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or other programmable device. In an alternative embodiment, for example, the processing device 110 may be a network processor having multiple processors including a core unit and multiple micro-engines. Additionally, the processing device 110 may include any combination of general-purpose processing device(s) and special-purpose processing device(s).

In one embodiment, the electronic system 100 is implemented in a device that includes the touch-sensing surface 116 as the user interface, such as handheld electronics, portable telephones, cellular telephones, notebook computers, personal computers, personal data assistants (PDAs), kiosks, keyboards, televisions, remote controls, monitors, handheld multi-media devices, handheld video players, gaming devices, control panels of a household or industrial appliances, or other computer peripheral or input devices. Alternatively, the electronic system 100 may be used in other types of devices. It should be noted that the components of electronic system 100 may include all the components described above. Alternatively, electronic system 100 may include only some of the components described above, or include additional components not listed herein.

Figure 2:
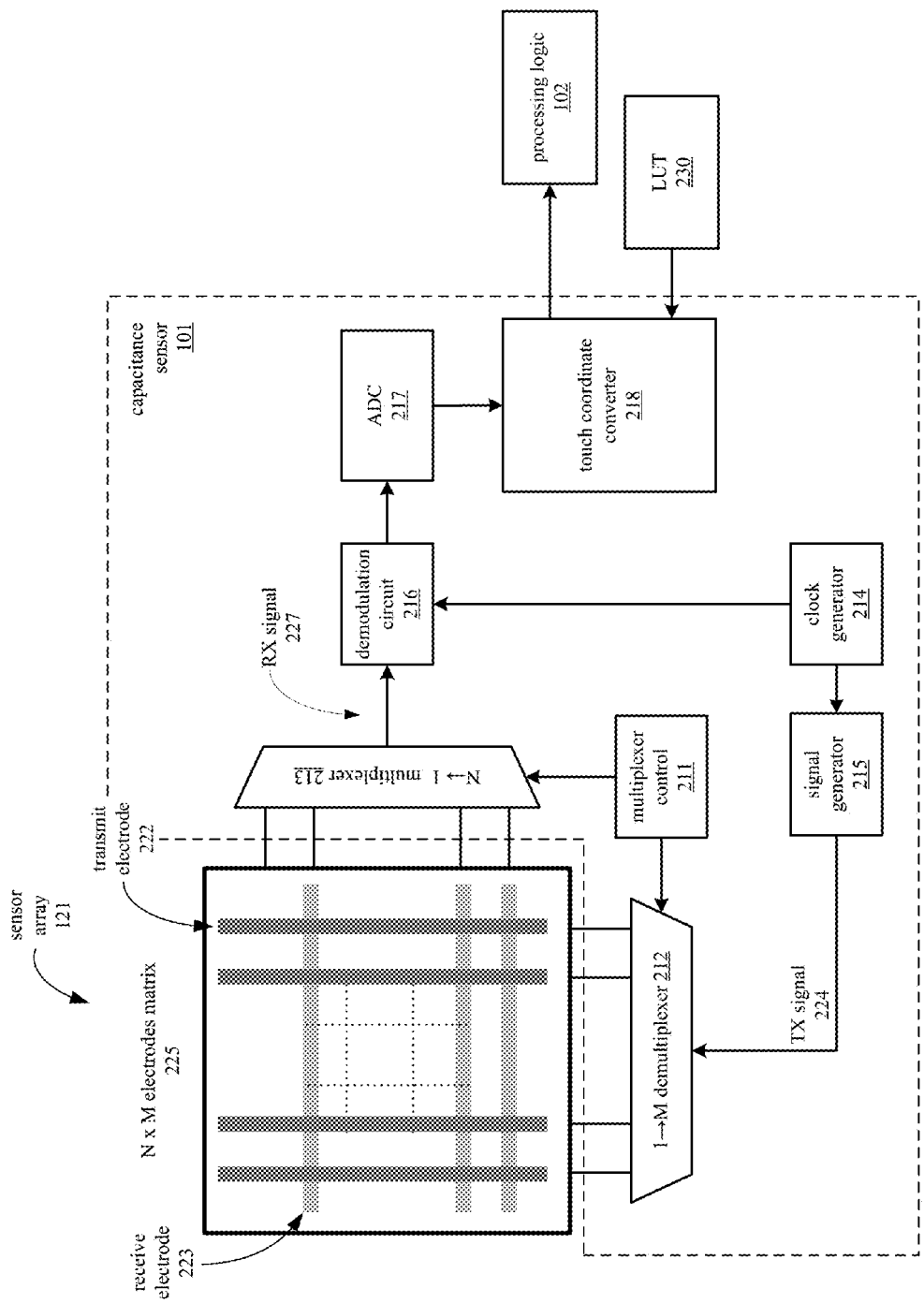
FIG. 2 is a block diagram illustrating an embodiment of an electronic system that processes touch sensor data.

FIG. 2 is a block diagram illustrating one embodiment of a capacitive touch sensor array 121 and a capacitance sensor 101 that converts changes in measured capacitances to coordinates indicating the presence and location of touch. The coordinates are calculated based on changes in measured capacitances relative to the capacitances of the same touch sensor array 121 in an un-touched state. In one embodiment, sensor array 121 and capacitance sensor 101 are implemented in a system such as electronic system 100. Sensor array 220 includes a matrix 225 of N×M electrodes (N receive electrodes and M transmit electrodes), which further includes transmit (TX) electrode 222 and receive (RX) electrode 223. Each of the electrodes in matrix 225 is connected with capacitance sensing circuit 201 through demultiplexer 212 and multiplexer 213.

Capacitance sensor 101 includes multiplexer control 211, demultiplexer 212 and multiplexer 213, clock generator 214, signal generator 215, demodulation circuit 216, and analog to digital converter (ADC) 217. ADC 217 is further coupled with touch coordinate converter 218. Touch coordinate converter 218 may be implemented in the processing logic 102.

The transmit and receive electrodes in the electrode matrix 225 may be arranged so that each of the transmit electrodes overlap and cross each of the receive electrodes such as to form an array of intersections, while maintaining galvanic isolation from each other. Thus, each transmit electrode may be capacitively coupled with each of the receive electrodes. For example, transmit electrode 222 is capacitively coupled with receive electrode 223 at the point where transmit electrode 222 and receive electrode 223 overlap.

Clock generator 214 supplies a clock signal to signal generator 215, which produces a TX signal 224 to be supplied to the transmit electrodes of touch sensor 121. In one embodiment, the signal generator 215 includes a set of switches that operate according to the clock signal from clock generator 214. The switches may generate a TX signal 224 by periodically connecting the output of signal generator 215 to a first voltage and then to a second voltage, wherein said first and second voltages are different.

The output of signal generator 215 is connected with demultiplexer 212, which allows the TX signal 224 to be applied to any of the M transmit electrodes of touch sensor 121. In one embodiment, multiplexer control 211 controls demultiplexer 212 so that the TX signal 224 is applied to each transmit electrode 222 in a controlled sequence. Demultiplexer 212 may also be used to ground, float, or connect an alternate signal to the other transmit electrodes to which the TX signal 224 is not currently being applied. In an alternate embodiment the TX signal 224 may be presented in a true form to a subset of the transmit electrodes 222 and in complement form to a second subset of the transmit electrodes 222, wherein there is no overlap in members of the first and second subset of transmit electrodes 222.

Because of the capacitive coupling between the transmit and receive electrodes, the TX signal 224 applied to each transmit electrode induces a current within each of the receive electrodes. For instance, when the TX signal 224 is applied to transmit electrode 222 through demultiplexer 212, the TX signal 224 induces an RX signal 227 on the receive electrodes in matrix 225. The RX signal 227 on each of the receive electrodes can then be measured in sequence by using multiplexer 213 to connect each of the N receive electrodes to demodulation circuit 216 in sequence.

The mutual capacitance associated with each intersection between a TX electrode and an RX electrode can be sensed by selecting every available combination of TX electrode and an RX electrode using demultiplexer 212 and multiplexer 213. To improve performance, multiplexer 213 may also be segmented to allow more than one of the receive electrodes in matrix 225 to be routed to additional demodulation circuits 216. In an optimized configuration, wherein there is a 1-to-1 correspondence of instances of demodulation circuit 216 with receive electrodes, multiplexer 213 may not be present in the system.

When an object, such as a finger, approaches the electrode matrix 225, the object causes a change in the measured mutual capacitance between only some of the electrodes. For example, if a finger is placed near the intersection of transmit electrode 222 and receive electrode 223, the presence of the finger will decrease the charge coupled between electrodes 222 and 223. Thus, the location of the finger on the touchpad can be determined by identifying the one or more receive electrodes having a decrease in measured mutual capacitance in addition to identifying the transmit electrode to which the TX signal 224 was applied at the time the decrease in capacitance was measured on the one or more receive electrodes.

By determining the mutual capacitances associated with each intersection of electrodes in the matrix 225, the presence and locations of one or more conductive objects may be determined. The determination may be sequential, in parallel, or may occur more frequently at commonly used electrodes.

In alternative embodiments, other methods for detecting the presence of a finger or other conductive object may be used where the finger or conductive object causes an increase in measured capacitance at one or more electrodes, which may be arranged in a grid or other pattern. For example, a finger placed near an electrode of a capacitive sensor may introduce an additional capacitance to ground that increases the total capacitance between the electrode and ground. The location of the finger can be determined based on the locations of one or more electrodes at which a change in measured capacitance is detected.

The induced current signal 227 is integrated by demodulation circuit 216. The rectified current output by demodulation circuit 216 can then be filtered and converted to a digital code by ADC 217.

A series of such digital codes measured from adjacent sensor or intersections may be converted to touch coordinates indicating a position of an input on touch sensor array 121 by touch coordinate converter 218. In one embodiment, the touch coordinate converter 218 may be coupled with a lookup table (LUT) 230. The LUT stores a number of correction vectors each corresponding to a different location on the capacitive sensor array. For example, each of the correction vectors may include correction values for adjusting along one or both of the x-axis and y-axis the touch coordinates calculated by the touch coordinate converter 218. In one embodiment, the touch-coordinate converter 218 selects from the LUT 230 the appropriate correction vector corresponding to the location of the calculated touch coordinates, then adjusts the touch coordinates according to the correction vector. In one embodiment, the correction vectors compensate for any systematic displacement error affecting the calculated touch coordinates. The corrected touch coordinates may then be used to detect gestures or perform other functions by the processing logic 102.

In one embodiment, the capacitance sensor 101 can be configured to detect multiple touches. One technique for the detection and location resolution of multiple touches uses a two-axis implementation: one axis to support rows and another axis to support columns. Additional axes, such as a diagonal axis, implemented on the surface using additional layers, can allow resolution of additional touches.

Figure 3A:
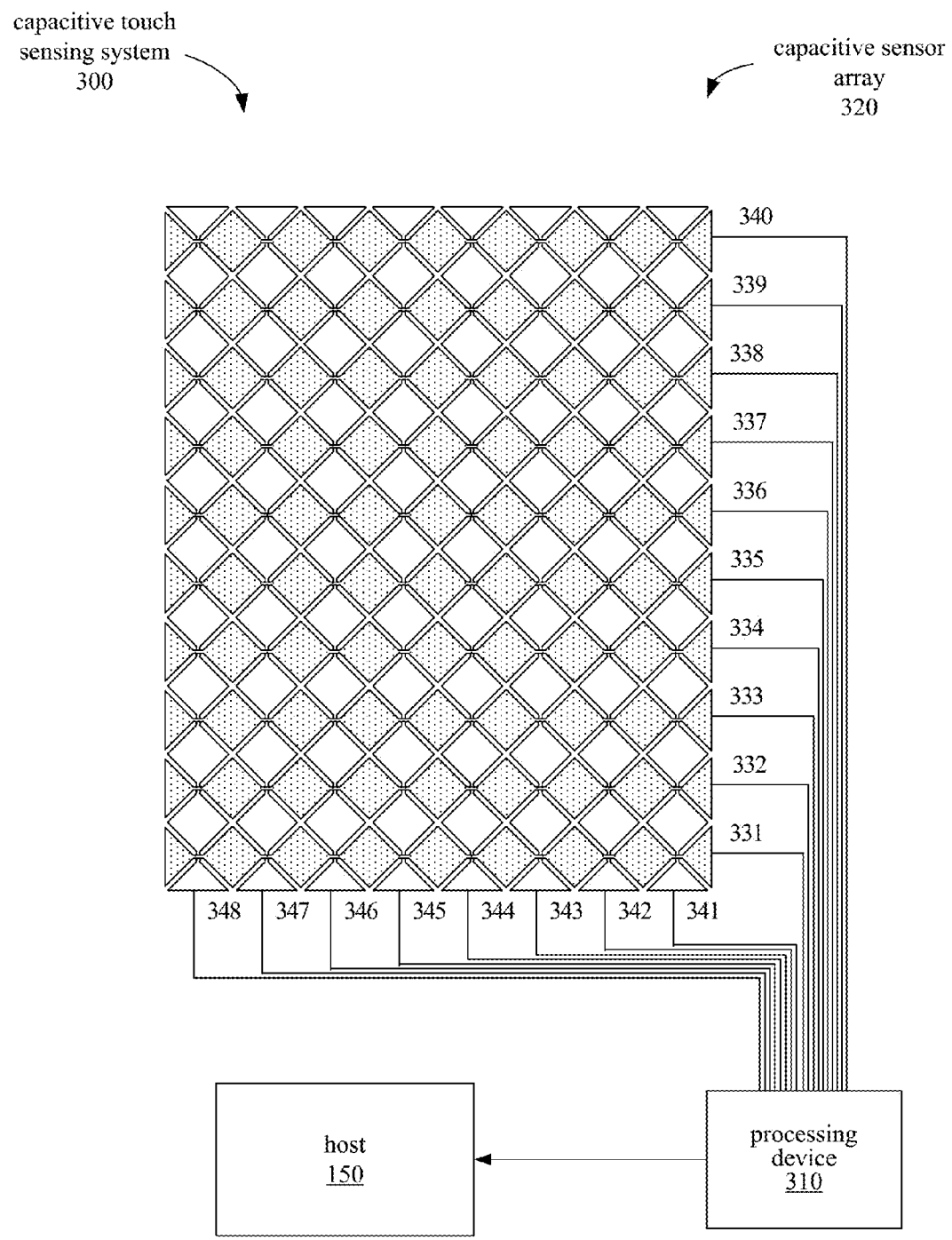
FIG. 3A illustrates an embodiment of an electronic touch-sensing system using a dual solid diamond capacitive sensor pattern.

FIG. 3A illustrates an embodiment of a capacitive touch sensing system 300 that includes a capacitive sensor array 320. Capacitive sensor array 320 includes a plurality of row sensor electrodes 331-340 and a plurality of column sensor electrodes 341-348. The row and column sensor electrodes 331-348 are connected to a processing device 310, which may include the functionality of capacitance sensor 101, as illustrated in FIG. 2. In one embodiment, the processing device 310 may perform TX-RX scans of the capacitive sensor array 320 to measure a mutual capacitance value associated with each of the intersections between a row sensor electrode and a column sensor electrode in the sensor array 320. The measured capacitances may be further processed to determine higher resolution locations of one or more contacts at the capacitive sensor array 320.

In one embodiment, the processing device 310 is connected to a host 150 which may receive the measured capacitances or calculate high precision locations from the processing device 310.

Figure 3B:
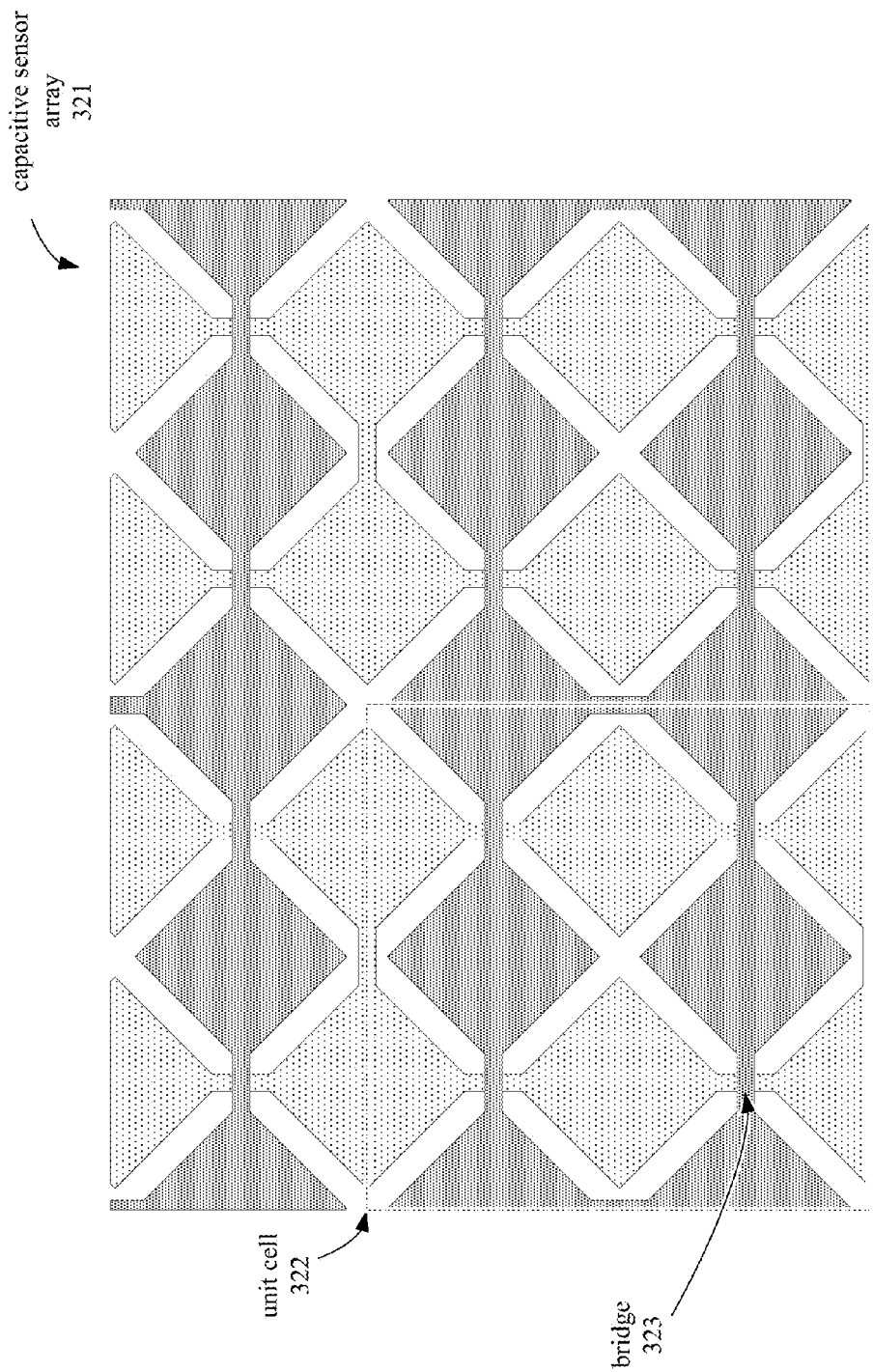
FIG. 3B illustrates an embodiment of a dual solid diamond capacitive sensor pattern.

The sensor array 320 illustrated in FIG. 3A includes sensor electrodes arranged in a diamond pattern. Specifically, the sensor electrodes 331-348 of sensor array 320 are arranged in a single solid diamond (SSD) pattern. FIG. 3B illustrates a capacitive sensor array 321 having an alternate embodiment of the diamond pattern, which is the dual solid diamond (DSD) pattern. Each of the sensor electrodes of capacitive sensor array 321 includes two rows or columns of electrically connected diamond shaped traces. Relative to the SSD pattern, the DSD pattern has improved signal disparity characteristics due to an increase in the coupling between TX and RX sensor electrodes while maintaining the same self-capacitance coupling possible between each sensor electrode and a conductive object near the sensor electrode. The DSD pattern may also provide higher sensitivity for tracking smaller objects, such as the point of a stylus, as compared to patterns having larger features, such as SSD. However, the DSD pattern also increases the number of bridges (such as bridge 323) used to create the pattern, which may result in decreased manufacturing yield. The increased number of bridges may also be visible if metal bridges are used. For example, sensor array 321 includes four bridges within unit cell 322.

Figure 4A:
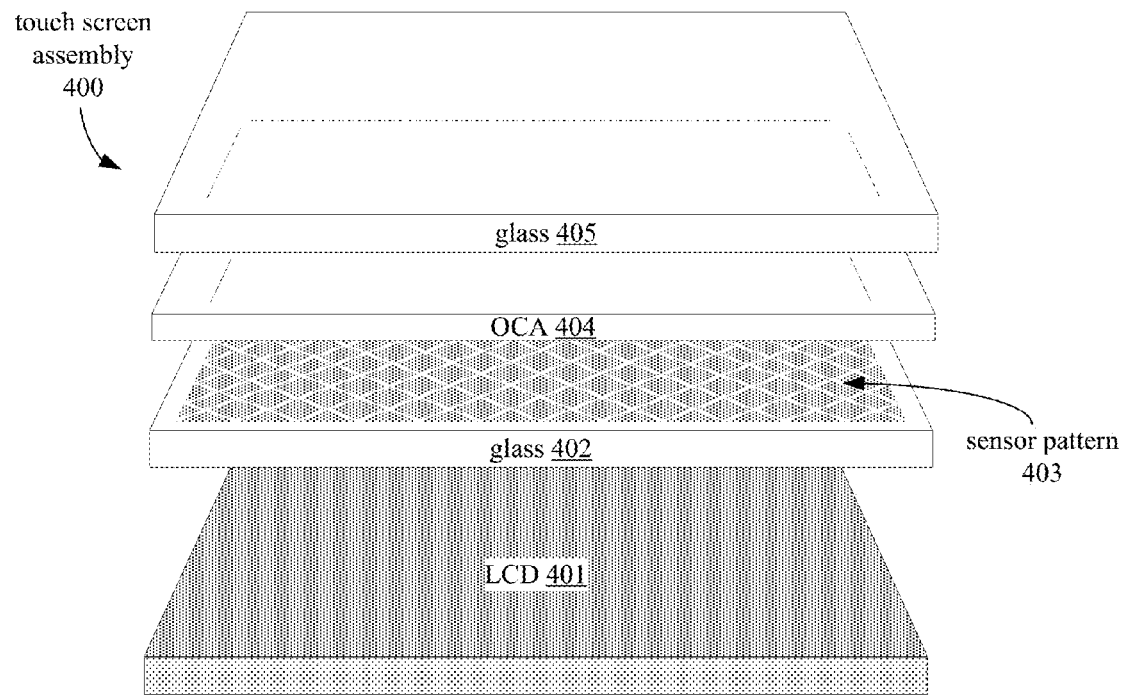
FIGS. 4A and 4B illustrate embodiments of touch screen assemblies.
Figure 4B:
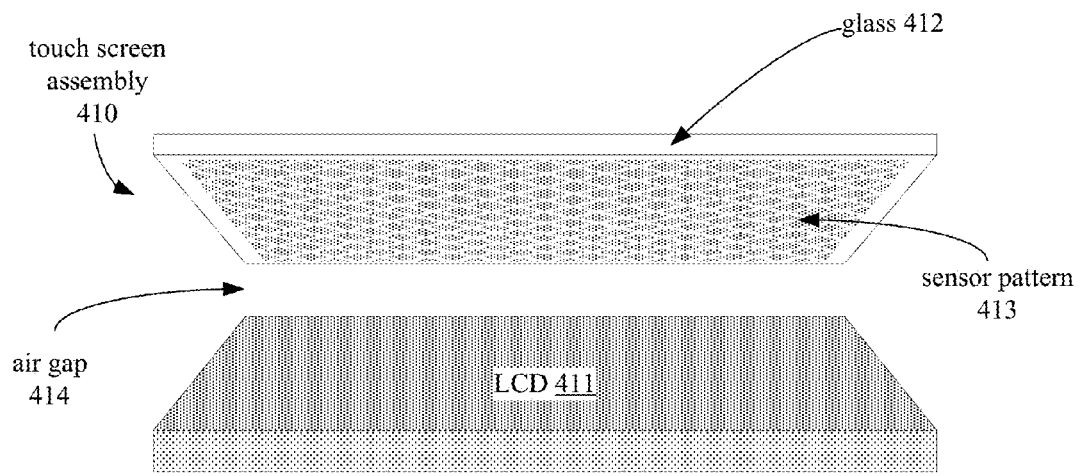

FIGS. 4A and 4B illustrate embodiments of touch screen assemblies 400 and 410, respectively, that include capacitive sensor arrays. Touch screen assembly 400 includes a liquid crystal display (LCD) 401 over which glass 402 is laid. A sensor pattern 403 is constructed on the surface of glass 402. In one embodiment, the sensor pattern 403 is constructed on the surface of glass 402 that faces away from the LCD 401. Optically clear adhesive (OCA) 404 may be used to bond glass 405 to the surface of glass 402 on which the sensor pattern 403 is constructed, thus protecting the sensor pattern 403. The sensor pattern 403 may be a SSD pattern, a DSD pattern, or another pattern as described in the following figures.

Touch screen assembly 410 includes an LCD 411, over which a glass 412 may be positioned. In one embodiment, sensor pattern 413 may be constructed on the surface of glass 412 that faces the LCD 411. In one embodiment, an air gap 414 may separate the glass 412 from the LCD 411.

In one embodiment, a capacitive sensor pattern such as the SSD pattern, DSD pattern, or other capacitive sensor pattern described herein may include row and column sensor electrodes that can be expressed as a matrix of the intersections between the row and column electrodes. Resolution of these sensor arrays may be represented as the product of the number of columns and the number of rows. For example, for a sensor array with N row electrodes and M column electrodes, the number of intersections would be N×M.

Figure 5:
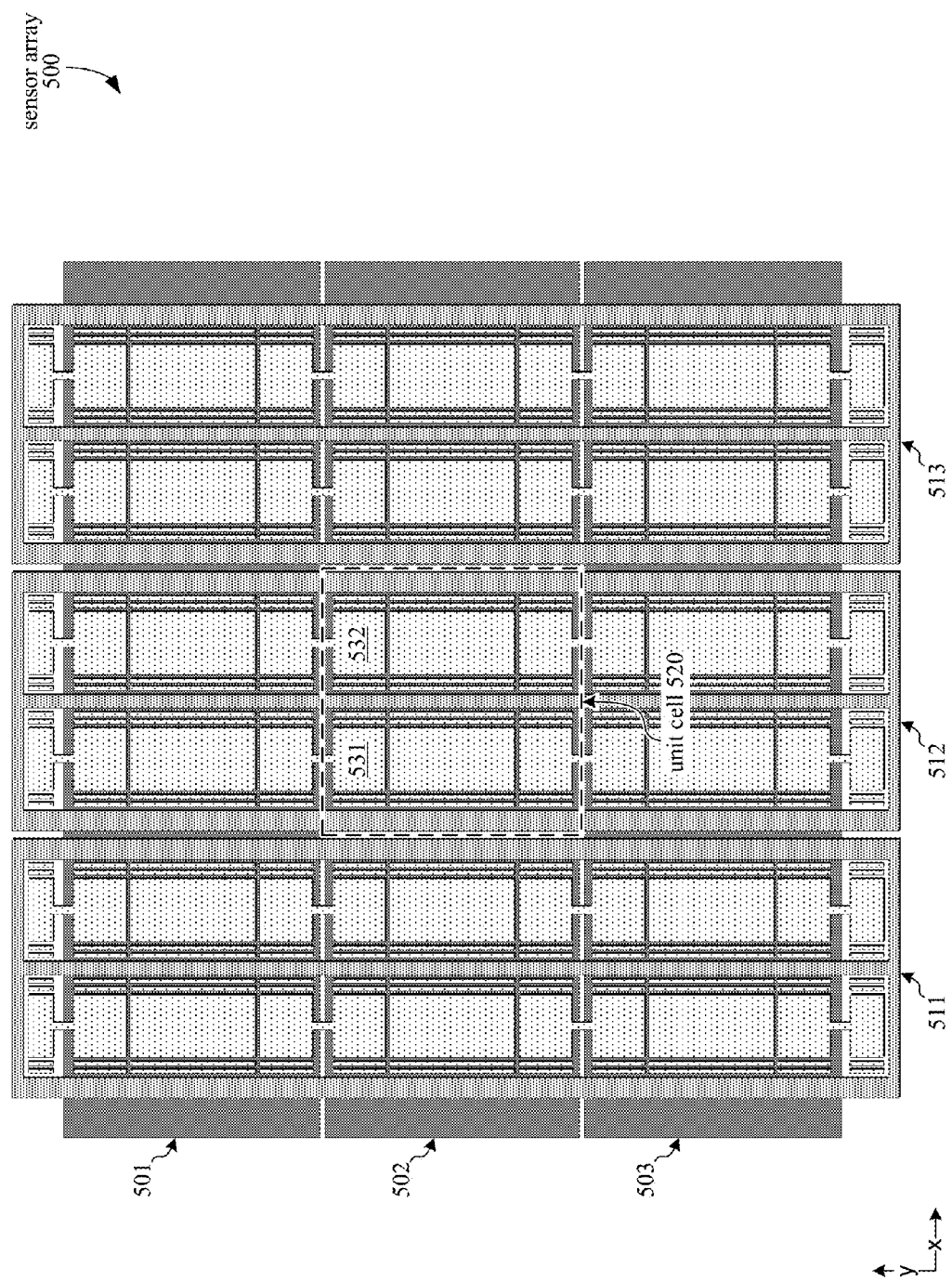
FIG. 5 illustrates an embodiment of a capacitive sensor array.

FIG. 5 illustrates a capacitive sensor array 500 that includes signal-spreading dummy electrodes, according to an embodiment. Capacitive sensor array 500 includes row sensor electrodes 501, 502, and 503, and column sensor electrodes 511, 512, and 513. Each of the row sensor electrodes 501-503 is capacitively coupled with each of the column sensor electrodes 511-513 to form a grid of unit cells. In one embodiment, the row sensor electrodes 501-503 are formed from a single layer of conductive material and the column sensor electrodes are formed from another layer of conductive material.

Each unit cell is associated with a particular pairing of a row sensor electrode and a column sensor electrode, and corresponds to an area within which the capacitive coupling between the row sensor electrode and the column sensor electrode is greater than for any other pairing of sensor electrodes. For example, unit cell 520 includes an area where the capacitance between sensor electrodes 502 and 512 is greater than the capacitance between any other pair of electrodes.

In one embodiment, capacitance sensor 101 performs a scan of the sensor array 500 by applying a transmit (TX) signal to each of the row sensor electrodes 501-503 and measuring a resulting receive (RX) signal generated at each of the column sensor electrodes 511-513. The sensor array 500 includes multiple signal-spreading dummy electrodes that are each capacitively coupled with at least two of the TX sensor electrodes. For example, each of the dummy electrodes 531 and 532 overlaps and is capacitively coupled with both of TX sensor electrodes 501 and 502.

Figure 6:
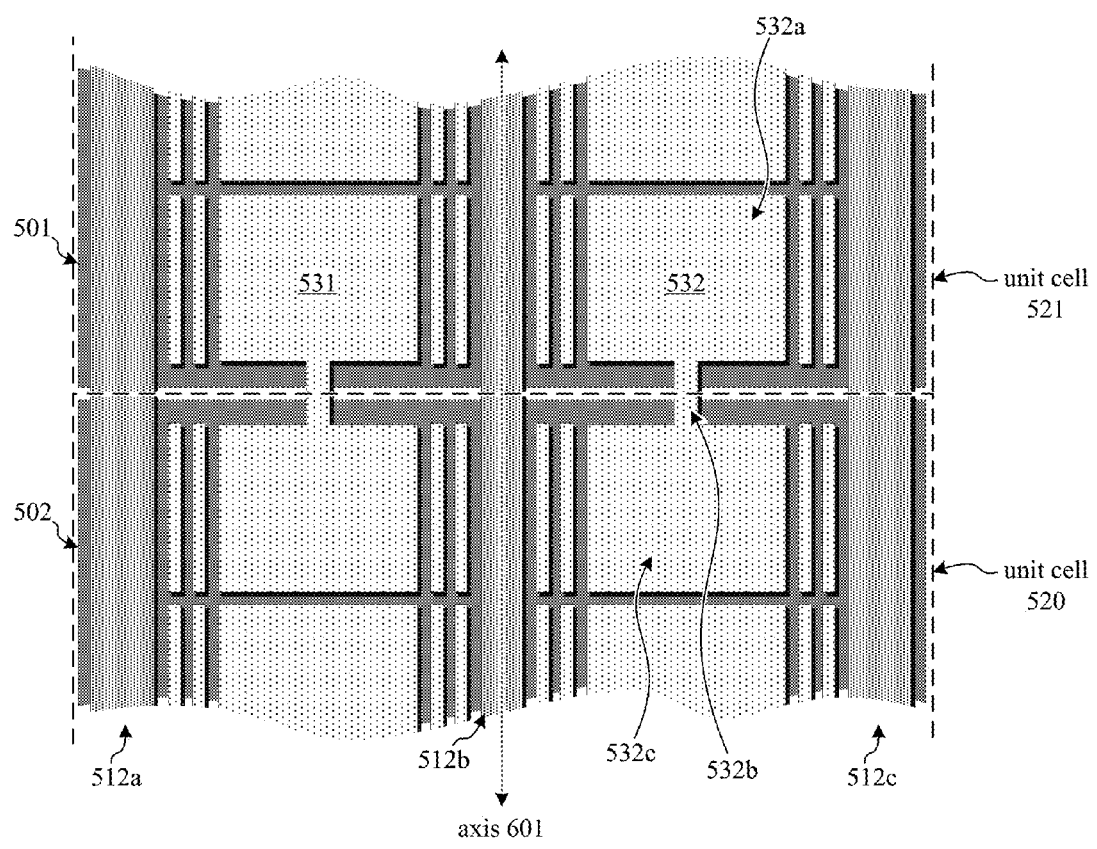
FIG. 6 illustrates a detail view of a capacitive sensor array with signal-spreading dummy electrodes, according to an embodiment.

FIG. 6 illustrates the signal-spreading dummy electrodes 531 and 532 in the sensor array 500, according to an embodiment. As illustrated in FIG. 6, each of the dummy electrodes 531 and 532 is located over a gap between the adjacent TX row sensor electrodes 501 and 502. Thus, each of the dummy electrodes 531 and 532 overlaps at least a portion of each of the row sensor electrodes 501 and 502 and is capacitively coupled with each of the sensor electrodes 501 and 502.

Thus, each of the dummy electrodes 531 and 532 is situated at least partially within the area of two adjacent unit cells 520 and 521. As illustrated in FIG. 6, the area of each dummy electrode 531 and 532 is approximately evenly divided between the unit cells 520 and 521. In one embodiment, the dummy electrodes 531 and 532 each comprise two smaller portions that are electrically connected by a connecting trace that is narrower than either of the portions. For example, the dummy electrode 532 is made up of a first portion 532a and a second portion 532c electrically connected together by a connecting trace 532b. The connecting trace 532b is narrower than either of the portions 532a and 532c in terms of the widths of these elements, as measured perpendicular to the longitudinal axis 601 of the column sensor electrode 512 (i.e., along the x-axis indicated in FIG. 6).

In one embodiment, the connecting trace 532b overlaps a gap between the adjacent row sensor electrodes 501 and 502 to mitigate the effects of lamination offset during the manufacturing process. For instance, a manufacturing process that positions a top layer of conductive material (including dummy electrode 532) over a bottom layer (including row electrodes 501 and 502) may result in an offset between the layers of as much as 0.2 millimeters in either direction along the y-axis from a nominal position which evenly divides the area of dummy electrode 532 between unit cells 520 and 521. Accordingly, the length of the connecting trace 532b along the longitudinal axis 601 of the column sensor electrode (i.e., parallel to the indicated y-axis) may be selected as 0.5 millimeters (at least double the tolerance of 0.2 millimeters). Since only the smaller area of the connecting trace 532b is subject to unequal division between unit cells 520 and 521 due to lamination offset, the possible variation of the total area of dummy electrode 532 caused by lamination offset can be reduced, relative to embodiments where the dummy electrode is not narrower across the gap between row electrodes.

Additionally, each of the dummy electrodes 531 and 532 also capacitively coupled with the RX column sensor electrode 512, illustrated in FIG. 6 as three subtraces 512a, 512b, and 512c, which are electrically coupled as can be seen in FIG. 5. In one embodiment, the width of the central subtrace 512b is less than the width of either of the outer subtraces 512a and 512c. As the central trace, subtrace 512b is nearer than the other subtraces 512a and 512c to a central longitudinal axis 601 of the column electrode 512. The signal spreading dummy electrodes 531 and 532 are located between the subtraces 512a-512c of the column electrode 512. In alternative embodiments, the column electrode may include fewer or more than three subtraces, with correspondingly fewer or more signal-spreading dummy electrodes in between the subtraces. In one embodiment, the subtraces may become progressively wider the farther they are positioned away from the central longitudinal axis of the column sensor electrode.

Figure 7A:
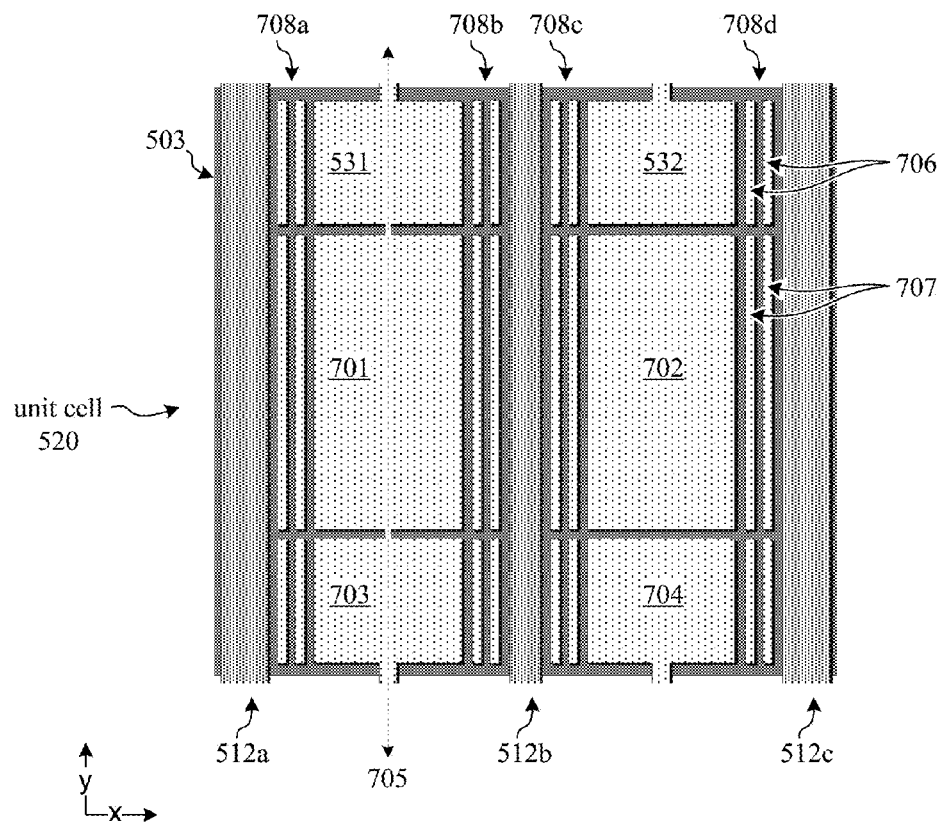
FIGS. 7A and 7B illustrate a unit cell and a cross-sectional view, respectively, of an embodiment of a capacitive sensor array having signal-spreading dummy electrodes.

FIG. 7A illustrates a unit cell 520 of sensor array 500, according to an embodiment. The unit cell 520, as illustrated in FIG. 7A, includes only part of each of the signal-spreading dummy electrodes 531, 532, 703, and 704. Each of the dummy electrodes 531, 532, 703, and 704 are located partially within unit cell 520 and partially within other unit cells adjacent to unit cell 520. Unit cell 520 also includes optical dummy electrodes 701 and 702, which are positioned in between the subtraces 512a, 512b, and 512c of the columns sensor electrode 512.

Optical dummy electrode 701 is positioned between the signal-spreading dummy electrodes 531 and 703 and optical dummy electrode 702 is positioned between the signal-spreading dummy electrodes 532 and 704. In one embodiment, each of the optical dummy electrodes 701 and 702 is formed from the same layer of conductive material as the column sensor electrode 512 and the signal-spreading dummy electrodes 531, 532, 703, and 704. Optical dummy electrodes such as electrodes 701 and 702 may minimize the gaps between the column sensor electrode 512 and the signal-spreading dummy electrodes 531, 532, 703, and 704, to improve optical uniformity for applications such as, for example, touch screens or transparent touch-sensing surfaces.

The pattern of conductive material in unit cell 520 also includes isolation regions 708a, 708b, 708c, and 708d between the subtraces 512a, 512b, and 512c of the RX column sensor electrode 512 and the dummy electrodes 531, 532, and 701-704. As illustrated in FIG. 7A, these isolation regions 708a-708d include additional optical dummy electrodes, such as 706 and 707. In one embodiment, each of these optical dummy electrodes 706 and 707 may be formed from the same layer of conductive material as the column sensor electrode 512 and the signal-spreading dummy electrodes 531, 532, 703, and 704.

In one embodiment, the isolation regions 708a-708d reduce crosstalk between the RX sensor electrode 512 and the signal-spreading dummy electrodes, while the optical dummy electrodes such as 706 and 707 occupy the space in the isolation regions 708a-708d to improve optical uniformity in the isolation regions 708a-708d. Accordingly, optical dummy electrodes may be positioned between a column sensor electrode and a signal-spreading dummy electrode; for example, dummy electrodes 706 are positioned between the column sensor electrode 512 and the signal-spreading dummy electrode 532. Other dummy electrodes may be positioned between a column sensor electrode and an optical dummy electrode; for example, dummy electrodes 707 are positioned between column sensor electrode 512 and optical dummy electrode 702. In an alternative embodiments, the isolation regions 708a-708d may not contain any dummy electrodes.

Figure 7B:
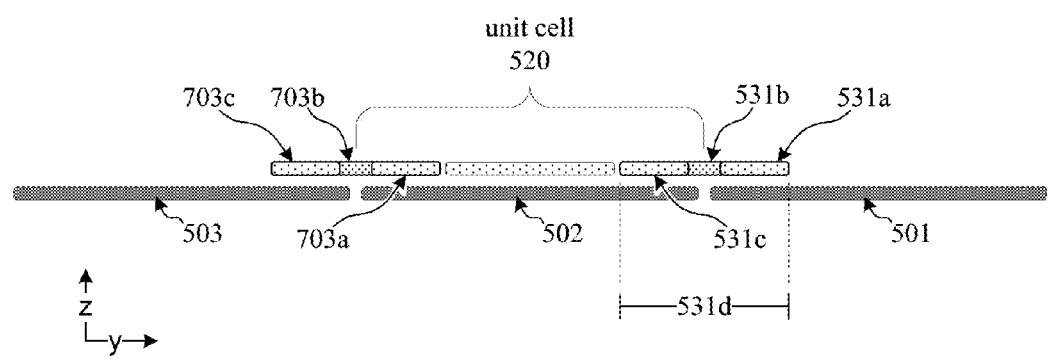

FIG. 7B illustrates a cross-section view of unit cell 520 along section line 705, as illustrated in FIG. 7A. Section line 705 runs parallel to the y-axis and intersects the dummy electrodes 531, 701, and 703, and the row sensor electrodes 501, 502, and 503. As illustrated in FIG. 7B, the signal-spreading dummy electrode 703 comprises two portions 703a and 703c that are electrically connected by a connecting trace 703b. The connecting trace 703b extends across the boundary of the unit cell 520, and overlaps the gap between row sensor electrodes 502 and 503. Similarly, the dummy electrode 531 comprises portions 531a and 531c connected together by connecting trace 531b. Trace 531b extends across the boundary of the unit cell 520 and overlaps the gap between row sensor electrodes 502 and 501.

In one embodiment, the length of each signal-spreading dummy electrode is at least half the length of the unit cell; for example, the length 531d of the dummy electrode 531 along the y-axis is at least half the length of the unit cell 520 along the y-axis. In alternative embodiments, the lengths of the signal spreading dummy electrodes may be greater or less than half the length of the unit cell.

Figure 8A:
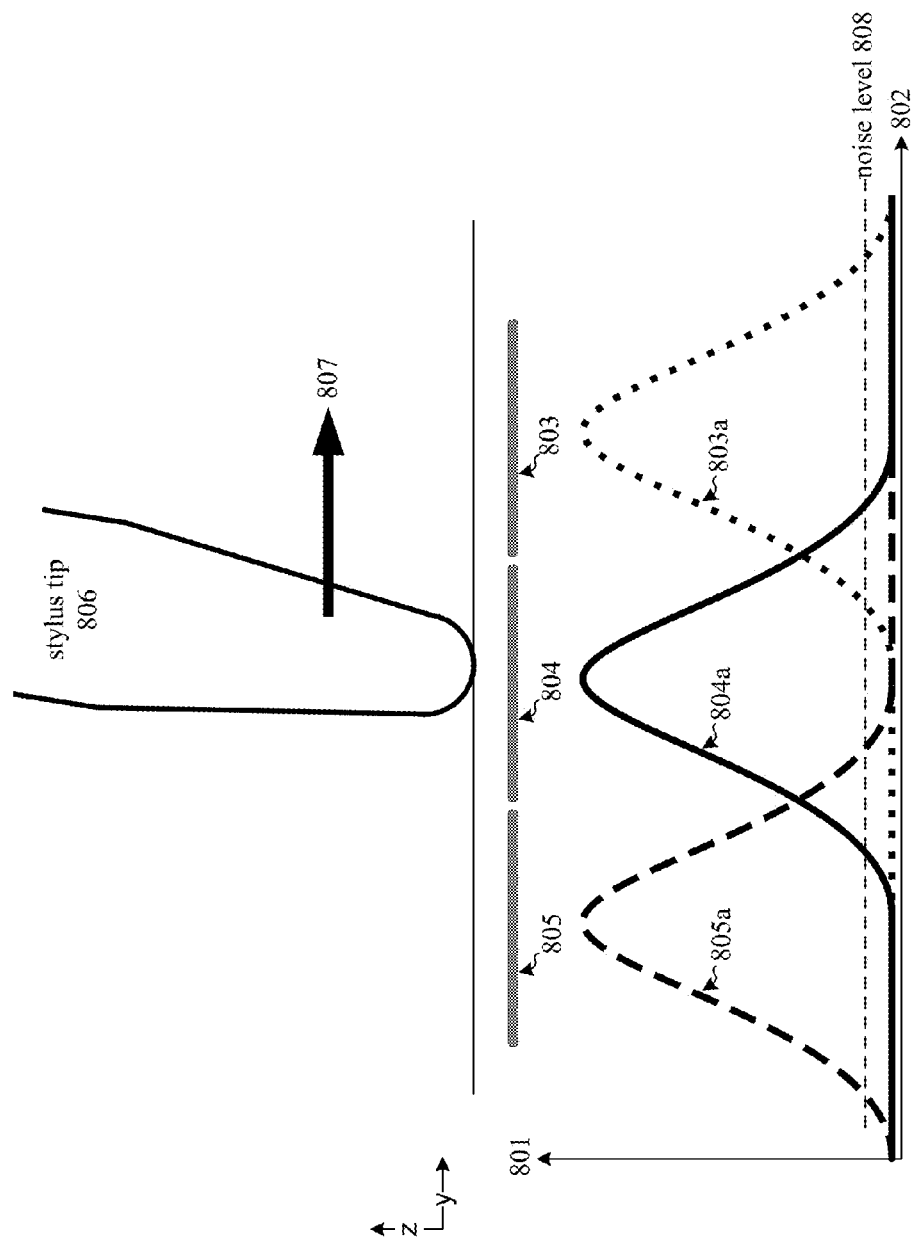
FIG. 8A illustrates a cross section view of three unit cells and corresponding capacitance profiles of a capacitive sensor array of FIG. 3B, according to one embodiment.
Figure 8B:
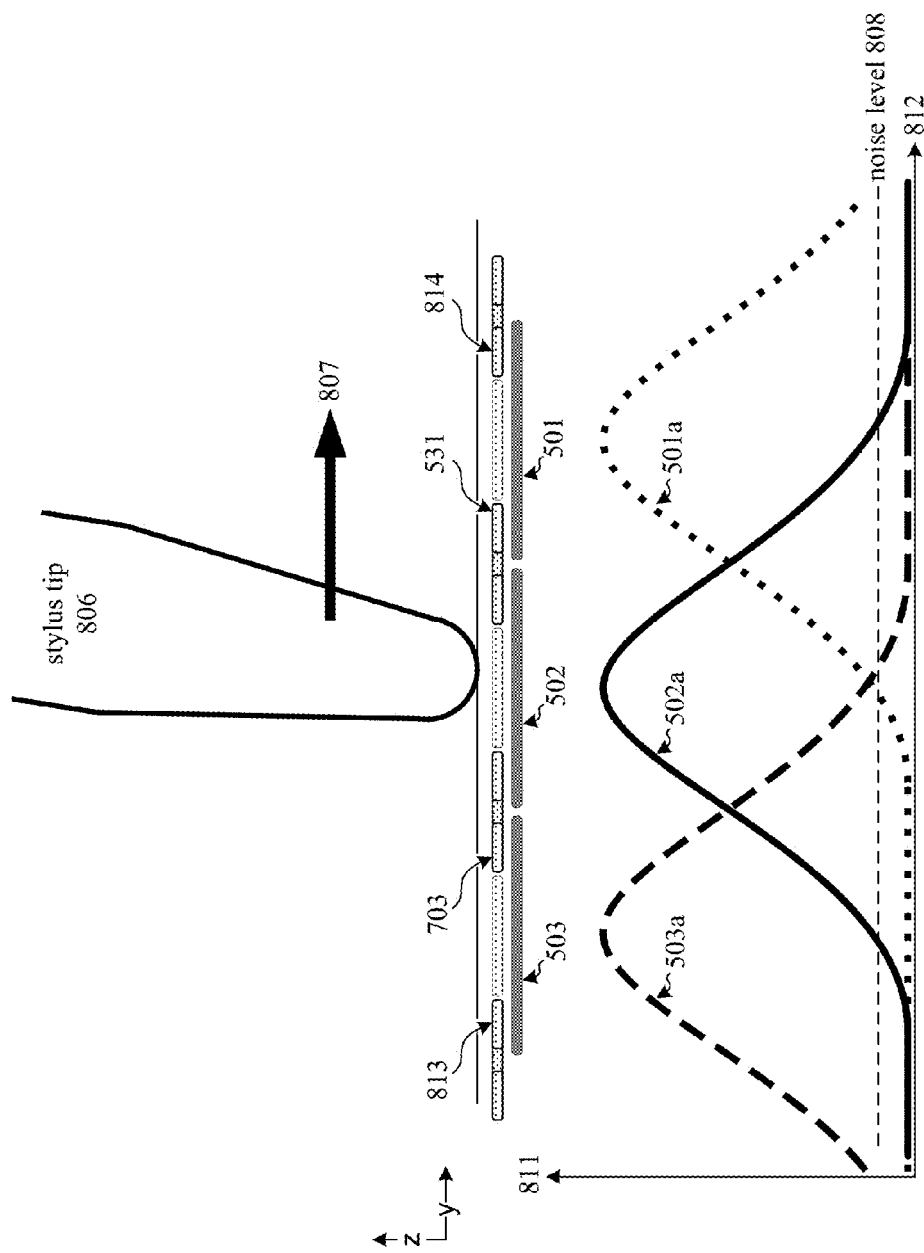
FIG. 8B illustrates a cross section view of three unit cells and corresponding capacitance profiles of a capacitive sensor array having signal-spreading dummy electrodes, according to one embodiment.

FIG. 8A and FIG. 8B illustrate cross sectional views of a sensor array without signal spreading dummy electrodes and a sensor array with signal-spreading dummy electrodes, respectively, along with their corresponding capacitance profiles, according to an embodiment. FIG. 8A illustrates unit cells 803, 804, and 805 from a capacitive sensor array without signal-spreading dummy electrodes, such as a single solid diamond or dual solid diamond pattern.

When a stylus tip 806 moves over the three unit cells 803, 804, and 805 in a direction 807 parallel to the y-axis, the unit cells 803, 804, and 805 produce corresponding signal profiles 803a, 804a, and 805a, respectively. As illustrated in FIG. 8A, a positive direction along the axis 801 corresponds to an increase in the signal, while the axis 802 indicates the position of the stylus tip 806. For each of the signal profiles 803a, 804a, and 805a, a maximum signal is observed when the stylus 806 is above a center of the unit cell. The signal descends quickly as stylus 806 is moved away from the center of the unit cell. When the signal strength falls below a noise level 808, the signal cannot be used for position calculation. When fewer than three of the signals are discernable above the noise level 808, the position of the stylus 806 may be inaccurately determined. A location within the unit cell where this tends to occur may be referred to as a "dead zone" in the unit cell. For example, such a "dead zone" may exist in the center of unit cell 804, where the signal levels 803a and 805a are both below the noise level 808.

FIG. 8B illustrates a cross-sectional view of TX row sensor electrodes 501, 502, and 503, along with signal spreading dummy electrodes 531, 703, 813, and 814. When a stylus tip 806 moves over the three unit cells including sensor electrodes 501, 502, and 503 in a direction 807 parallel to the y-axis, the sensor electrodes 501, 502, and 503 produce corresponding signal profiles 501a, 502a, and 503a, respectively. As illustrated in FIG. 8B, a positive direction along the axis 811 corresponds to an increase in the signal, while the axis 812 indicates the position of the stylus tip 806.

A maximum signal for a sensor electrode is observed when the stylus 806 is above a center of the sensor electrode. The capacitive sensor array with signal-spreading dummy electrodes, such as electrodes 531 and 703, widens the signal profiles 501a, 502a, and 503a. In contrast with the signal profiles illustrated in FIG. 8A, the signal profiles 501a, 502a, and 503a do not descend as quickly when the stylus 806 is moved away from the center of the corresponding electrode. With regard to the TX row sensor electrode 502, for example, the electrode 502 is capacitively coupled with the signal-spreading dummy electrodes 531 and 703. Thus, a TX signal applied to sensor electrode 502 is additionally applied to dummy electrodes 531 and 703 via the capacitive coupling. The resulting set of electrodes 703, 502, and 531 to which the TX signal is applied is physically wider than the sensor pitch (i.e., the distance between corresponding portions of adjacent row sensor electrodes). Accordingly, the stylus 806 may be sensed over a wider span, resulting in a wider signal profile 502a for the sensor pattern with signal-spreading dummy electrodes, as compared to a sensor pattern without the signal-spreading dummy electrodes.

The adjacent TX row sensor electrodes 501 and 503 operate in similar fashion; for example, sensor electrode 501 is capacitively coupled with signal-spreading dummy electrodes 531 and 814, while sensor electrode 503 is capacitively coupled with signal-spreading dummy electrodes 813 and 703. This results in wider signal profiles 501a and 503a corresponding to the sensor electrodes 501 and 503, respectively.

Provided the same sensor pitch as the sensor pattern illustrated in FIG. 8A, the wider signal profiles 501a and 503a cross at a higher point than the signal profiles 803a and 805a. As a result, all three signals are above the noise level 808 when the stylus 806 is at the center of electrode 502. The unit cells of the sensor pattern in FIG. 8B therefore do not have a dead zone at this noise level 808. As described above, the sensor pitch can be measured between a center of one unit cell and a center of an adjacent unit cell. Alternatively, the sensor pitch can be measured from one edge of an electrode to the corresponding edge of the adjacent electrode to include the width of the electrode and the gap between the electrodes.

In one embodiment, signal spreading dummies widen the signal profile for a stylus or other conductive object moving along the y-axis, while the differences in widths of the RX subtraces widen the signal profile for conductive objects moving in the direction of the x-axis. With reference to FIG. 6, for example, the arrangement of wider subtraces 512a and 512c at the edges of sensor electrode 512 and a thinner subtrace 512b along the center of electrode 512 provides for increased sensitivity at the edges and decreased sensitivity in the center, thus widening the overall signal profile.

Figure 9:
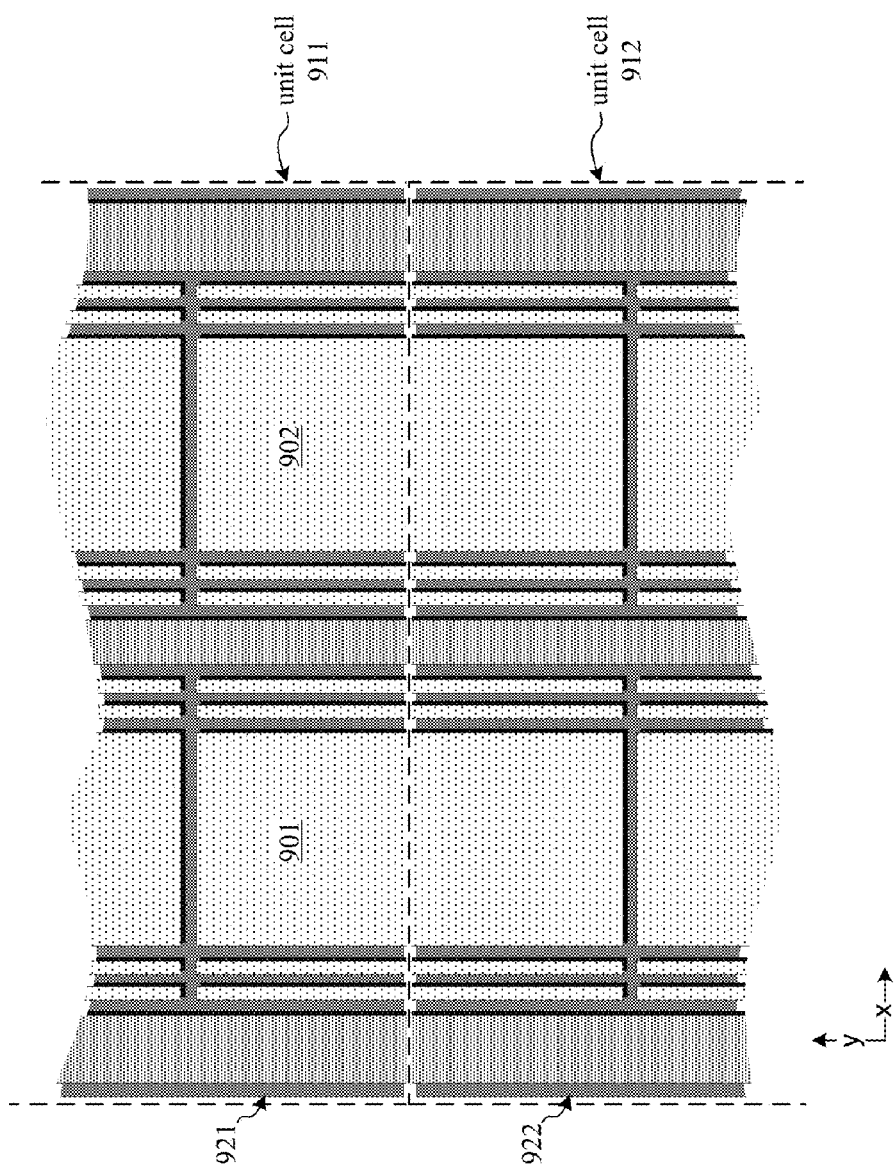
FIG. 9 illustrates an embodiment of a capacitive sensor array having signal-spreading dummy electrodes.

FIG. 9 illustrates signal-spreading dummy electrodes in a sensor array pattern, according to an embodiment. The signal-spreading dummy electrodes 901 and 902 function in similar fashion as the dummy electrodes 531 and 532 illustrated in FIG. 6. Each of the dummy electrodes 901 and 902 overlaps two adjacent row sensor electrodes 921 and 922; however, in contrast with the electrodes 531 and 532, the electrodes 901 and 902 lack a narrower connecting trace across the gap between the sensor electrodes 921 and 922, which corresponds to a boundary between the unit cells 911 and 912. Such signal-spreading dummy electrodes 901 and 902 lacking a narrow connecting trace may be used when the lamination offset tolerance is relatively small when compared to the size of the dummy electrodes 901 and 902, or when the lamination offset is otherwise compensated.

Figure 10:
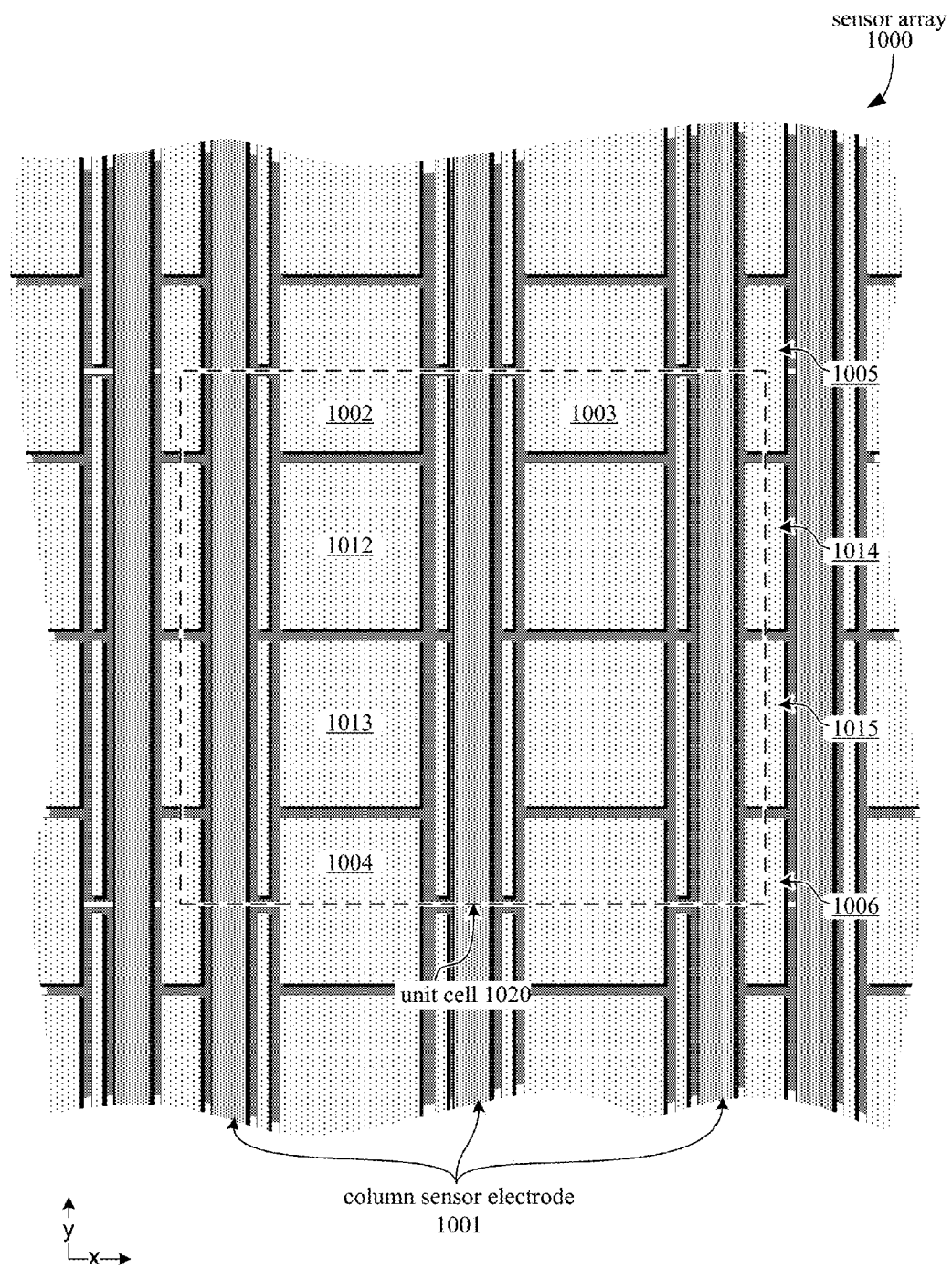
FIG. 10 illustrates an embodiment of a capacitive sensor array having signal-spreading dummy electrodes.

FIG. 10 illustrates a capacitive sensor pattern according to an embodiment, showing additional possible placements for dummy electrodes in the sensor pattern. The sensor array 1000 illustrated in FIG. 10 includes signal spreading dummy electrodes 1002-1006 that are less than half the length of the unit cell, as measured along the y-axis. For example, the dummy electrodes 1002-1006 are slightly less than one-third the length of the unit cell 1020, as measured along the y-axis.

Among the signal-spreading dummy electrodes 1002-1006, electrodes 1002-1004 are located within the perimeter of the column sensor electrode 1001, while electrodes 1005 and 1006 are located outside the perimeter of the column sensor electrode 1001. In other words, electrodes 1002-1004 are located between the subtraces of sensor electrode 1001, while electrodes 1005 and 1006 are not located between the subtraces of sensor electrode 1001.

Sensor array 1000 additionally includes more than one optical dummy electrode 1012 and 1013 in between the subtraces of the column sensor electrode 1001 and between the signal-spreading dummy electrodes 1002 and 1004. Additional optical dummy electrodes 1014 and 1015 are located outside the perimeter of the column sensor electrode 1001, between the column sensor electrode 1001 and an adjacent column sensor electrode, and between the signal-spreading dummy electrodes 1005 and 1006.

Figure 11:
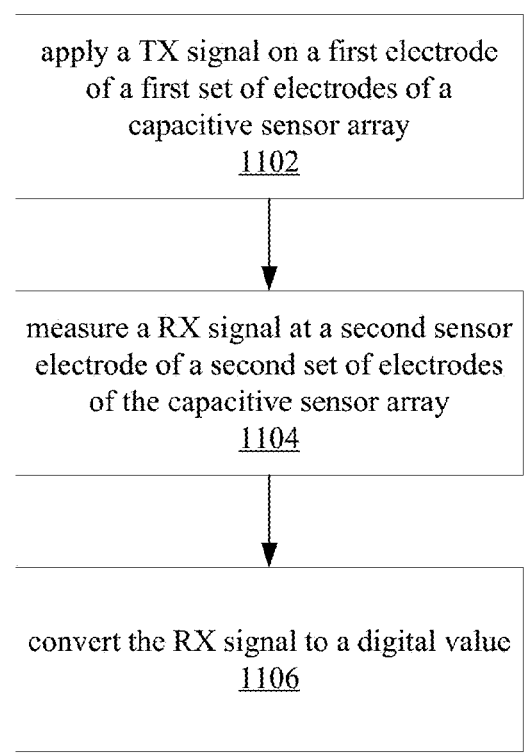
FIG. 11 is a flow diagram of a method of sensing a capacitive sensor array having signal-spreading dummy electrodes, according to an embodiment.

FIG. 11 is a flow diagram of a sensing method 1100 of sensing a capacitive sensor array with signal-spreading dummy electrodes, according to an embodiment. The method 1100 may be performed by processing logic that may include hardware (circuitry, dedicated logic, etc.), software (such as is run on a general purpose computing system or a dedicated machine), firmware (embedded software), or any combination thereof. In one embodiment, the processing device 110 of FIG. 1 performs some or all of method 1100. In another embodiment, the processing logic 102 of FIG. 1 or FIG. 2 performs some or all of the operations of method 1100. In other embodiments, the capacitance-sensing circuit 101 performs some of the operations of method 1100. Alternatively, other components of the electronic system 100 of FIG. 1 perform some or all of the operations of method 1100.

In FIG. 11, method 1100 begins at block 1102 with the processing logic applying a transmit (TX) signal on a first electrode of a first set of electrodes of a capacitive sensor array. For example, the TX signal may be applied to the row sensor electrode 501 illustrated in FIG. 5. At block 1104, the processing logic measures a receive (RX) signal on a second electrode of a second set of electrodes. For example, the RX signal may be measured at column electrode 511 illustrated in FIG. 5. Each electrode of the first set of electrodes intersects each of the second set of electrodes to form unit cells each corresponding to an intersection of a pair of electrodes comprising one electrode from the first set and one electrode from the second set. At block 1106, the processing logic converts the measured RX signal into a first digital value, which represents a first capacitance at the intersection between the first electrode and the second electrode. The operations of method 1100 may be repeated for each pair of sensor electrodes comprising one TX row sensor electrode and one RX column sensor electrode in order to detect one or more conductive objects at the surface of the capacitive sensor array.

In the foregoing embodiments, various modifications can be made; for example, row sensor electrodes and column sensor electrodes may be interchanged, and row or column sensor electrodes may be used as either TX or RX sensor electrodes. Furthermore, in some embodiments, intersections between row and column sensor electrodes may be replaced with conductive bridges. For example, bridges may be used to electrically connect portions of sensor electrodes when both row and column sensor electrodes are constructed from a single layer of conductive material. As described herein, conductive electrodes that are "electrically connected" or "electrically coupled" may be coupled such that a relatively low resistance conductive path exists between the conductive electrodes. The terms "substantially" and "approximately" may indicate values or characteristics that may deviate from a nominal value or ideal characteristic (where such deviation may result from manufacturing tolerances, rounding error, and the like) while the desired effect of the nominal value or ideal characteristic is preserved.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A capacitive sensor array, comprising:
    a plurality of row sensor electrodes;
    a column sensor electrode capacitively coupled with each row sensor electrode of the plurality of row sensor electrodes to form a plurality of unit cells, wherein for each row sensor electrode of the plurality of row sensor electrodes, each point within a unit cell of the plurality of unit cells that is associated with the column sensor electrode and the row sensor electrode is nearer to a location of a shortest distance between the row electrode and the column electrode than to a location of a shortest distance between any other row electrode and the column electrode; and
    a first plurality of dummy electrodes, wherein each of the first plurality of dummy electrodes is floating and is capacitively coupled with the column sensor electrode and two adjacent row sensor electrodes of the plurality of row sensor electrodes, and wherein each of the first plurality of dummy electrodes has a total area smaller than at least one of the plurality of unit cells.

2. The capacitive sensor array of claim 1, wherein the column sensor electrode further comprises a plurality of subtraces.

3. The capacitive sensor array of claim 2, wherein a first subtrace of the plurality of subtraces having a width that is less than a width of a second subtrace of the plurality of subtraces is nearer than the second subtrace to a central axis of the column electrode.

4. The capacitive sensor array of claim 2, wherein each of the first plurality of dummy electrodes is located between the plurality of subtraces of the column electrode, and wherein for each dummy electrode of the first plurality of dummy electrodes, the dummy electrode has a length that is at least half the length, along a longitudinal axis of the column sensor electrode, of a unit cell including at least a portion of the dummy electrode.

5. The capacitive sensor array of claim 1, wherein for each dummy electrode of the first plurality of dummy electrodes, the dummy electrode overlaps at least two adjacent unit cells of the plurality of unit cells.

6. The capacitive sensor array of claim 1, wherein the plurality of row sensor electrodes is formed from a first layer of conductive material, wherein the column sensor electrode is one of a plurality of column sensor electrodes formed from a second layer of conductive material, wherein the first plurality of dummy electrodes is formed from the second layer of conductive material, and wherein for each dummy electrode of the first plurality of dummy electrodes, the dummy electrode overlaps each of the two adjacent row sensor electrodes to which the dummy electrode is capacitively coupled.

7. The capacitive sensor array of claim 1, wherein each dummy electrode of the first plurality of dummy electrodes comprises a first portion and a second portion coupled together by a connecting trace that is narrower than either of the first portion and the second portion and that overlaps a gap between the two adjacent row sensor electrodes to which the dummy electrode is capacitively coupled.

8. The capacitive sensor array of claim 7, wherein a length of the connecting trace along a longitudinal axis of the column sensor electrode is at least 0.5 millimeters.

9. The capacitive sensor array of claim 1, further comprising a plurality of optical dummy electrodes, wherein each optical dummy electrode of the plurality of optical dummy electrodes is formed from a same layer of conductive material as the column sensor electrode and is located between subtraces of the column sensor electrode.

10. A capacitive sensor array, comprising:
    a plurality of row sensor electrodes;
    a column sensor electrode capacitively coupled with each row sensor electrode of the plurality of row sensor electrodes to form a plurality of unit cells, wherein for each row sensor electrode of the plurality of row sensor electrodes, each point within a unit cell of the plurality of unit cells that is associated with the column sensor electrode and the row sensor electrode is nearer to a location of a shortest distance between the row electrode and the column electrode than to a location of a shortest distance between any other row electrode and the column electrode; and a first plurality of dummy electrodes, wherein for each dummy electrode of the first plurality of dummy electrodes, the dummy electrode is floating and overlaps at least two adjacent unit cells of the plurality of unit cells and has a total area smaller than at least one of the plurality of unit cells.

11. The capacitive sensor array of claim 10, wherein the column sensor electrode further comprises a plurality of subtraces.

12. The capacitive sensor array of claim 11, wherein a first subtrace of the plurality of subtraces having a width that is less than a width of a second subtrace of the plurality of subtraces is nearer than the second subtrace to a central axis of the column electrode.

13. The capacitive sensor array of claim 11, wherein each of the first plurality of dummy electrodes is located between the plurality of subtraces of the column electrode, and wherein for each dummy electrode of the first plurality of dummy electrodes, the dummy electrode has a length that is at least half the length, along a longitudinal axis of the column sensor electrode, of a unit cell including at least a portion of the dummy electrode.

14. The capacitive sensor array of claim 10, wherein the plurality of row sensor electrodes is formed from a first layer of conductive material, wherein the column sensor electrode is one of a plurality of column sensor electrodes formed from a second layer of conductive material, wherein the first plurality of dummy electrodes is formed from the second layer of conductive material, and wherein for each dummy electrode of the first plurality of dummy electrodes, the dummy electrode overlaps each of two adjacent row sensor electrodes to which the dummy electrode is capacitively coupled.

15. The capacitive sensor array of claim 10, wherein each dummy electrode of the first plurality of dummy electrodes comprises a first portion and a second portion coupled together by a connecting trace that is narrower than either of the first portion and the second portion and that overlaps a boundary between the two adjacent unit cells, wherein a length of the connecting trace along a longitudinal axis of the column sensor electrode is at least 0.5 millimeters.

16. A capacitance sensing system, comprising:
a capacitance sensor;
a capacitive sensor array coupled with the capacitance sensor, wherein the capacitive sensor array comprises:
a plurality of row sensor electrodes;
a column sensor electrode capacitively coupled with each row sensor electrode of the plurality of row sensor electrodes to form a plurality of unit cells, wherein for each row sensor electrode of the plurality of row sensor electrodes, each point within a unit cell of the plurality of unit cells that is associated with the column sensor electrode and the row sensor electrode is nearer to a location of a shortest distance between the row electrode and the column electrode than to a location of a shortest distance between any other row electrode and the column electrode; and
a first plurality of dummy electrodes, wherein each dummy electrode is floating and is capacitively coupled with the column sensor electrode and two adjacent row sensor electrodes of the plurality of row sensor electrodes, and wherein each of the first plurality of dummy electrodes has a total area smaller than at least one of the plurality of unit cells.

17. The capacitance sensing system of claim 16, further comprising a lookup table (LUT) coupled with the capacitance sensor, wherein the LUT is configured to store a plurality of correction vectors each corresponding to a different location on the capacitive sensor array.

18. The capacitance sensing system of claim 16, wherein the capacitance sensor is configured to apply a transmit (TX) signal to each of the plurality of row sensor electrodes, and to measure a resulting receive (RX) signal at each of the plurality of column sensor electrodes.

19. The capacitance sensing system of claim 16, wherein the column sensor electrode further comprises a plurality of subtraces, wherein a first subtrace of the plurality of subtraces having a width that is less than a width of a second subtrace of the plurality of subtraces is nearer than the second subtrace to a central axis of the column electrode.

20. The capacitance sensing system of claim 16, wherein the plurality of row sensor electrodes is formed from a first layer of conductive material, wherein the column sensor electrode is one of a plurality of column sensor electrodes formed from a second layer of conductive material, wherein the first plurality of dummy electrodes is formed from the second layer of conductive material and overlaps, wherein for each dummy electrode of the first plurality of dummy electrodes, the dummy electrode overlaps each of the two adjacent row sensor electrodes to which the dummy electrode is capacitively coupled, and wherein each dummy electrode of the first plurality of dummy electrodes comprises a first portion and a second portion coupled together by a connecting trace thinner than either of the first portion and the second portion and overlapping a gap between the two adjacent row sensor electrodes to which the dummy electrode is capacitively coupled.

* * * * *